(12) United States Patent
Barnett (10) Patent No.: US 7,113,033 B2
(45) Date of Patent: Sep. 26, 2006

(54) VARIABLE IMPEDANCE LOAD FOR A VARIABLE GAIN RADIO FREQUENCY AMPLIFIER

(75) Inventor: Kenneth Barnett, Carlsbad, CA (US)

(73) Assignee: Qualcomm Incorporated, San Diego, CA (US)

( * ) Notice: Subject to any disclaimer, the term of this patent is extended or adjusted under 35 U.S.C. 154(b) by 363 days.

(21) Appl. No.: 10/061,889

(22) Filed: Jan. 31, 2002

(65) Prior Publication Data

US 2003/0141927 A1 Jul. 31, 2003

(51) Int. Cl.
*H03G 3/20* (2006.01)
(52) U.S. Cl. .................. 330/129; 330/148; 330/278
(58) Field of Classification Search ................ 330/129, 330/144, 254, 278, 279
See application file for complete search history.

(56) References Cited

U.S. PATENT DOCUMENTS

| | | | |
|---|---|---|---|
| 5,661,437 A | 8/1997 | Nishikawa et al. | 330/282 |
| 5,757,230 A * | 5/1998 | Mangelsdorf | 330/133 |
| 5,834,975 A | 11/1998 | Bartlett et al. | 330/278 |
| 6,160,449 A * | 12/2000 | Klomsdorf et al. | 330/279 |
| 6,424,222 B1 * | 7/2002 | Jeong et al. | 330/285 |
| 6,438,360 B1 * | 8/2002 | Alberth et al. | 330/129 |
| 6,556,814 B1 * | 4/2003 | Klomsdorf et al. | 455/121 |
| 6,621,348 B1 * | 9/2003 | Connell et al. | 330/296 |
| 6,657,494 B1 * | 12/2003 | Twomey | 330/254 |

FOREIGN PATENT DOCUMENTS

| | | |
|---|---|---|
| EP | 637131 | 2/1995 |
| EP | 1148633 | 10/2001 |

* cited by examiner

*Primary Examiner*—Khanh Van Nguyen
(74) *Attorney, Agent, or Firm*—Philip Wadsworth; Charles D. Brown; Howard H. Seo (57) ABSTRACT

A variable impedance load (104) is provided at the output of a radio frequency (RF) driver amplifier (102) having a variable gain. In an exemplary embodiment, the variable load (104) comprises a resistor (R) in series with a semiconductor device ($M_1$). The semiconductor device ($M_1$) has an impedance level determined by a drive current. The value of the drive current is related to the gain of the RF driver amplifier (102).

17 Claims, 7 Drawing Sheets

VARIABLE IMPEDANCE LOAD FOR A VARIABLE GAIN RADIO FREQUENCY AMPLIFIER

BACKGROUND OF THE INVENTION

1. Field of the Invention

The present invention is directed generally to wireless communication devices and, more particularly, to a variable impedance load for a variable gain radio frequency amplifier used in the output stage of a wireless communication device.

2. Description of the Related Art

Figure 1:
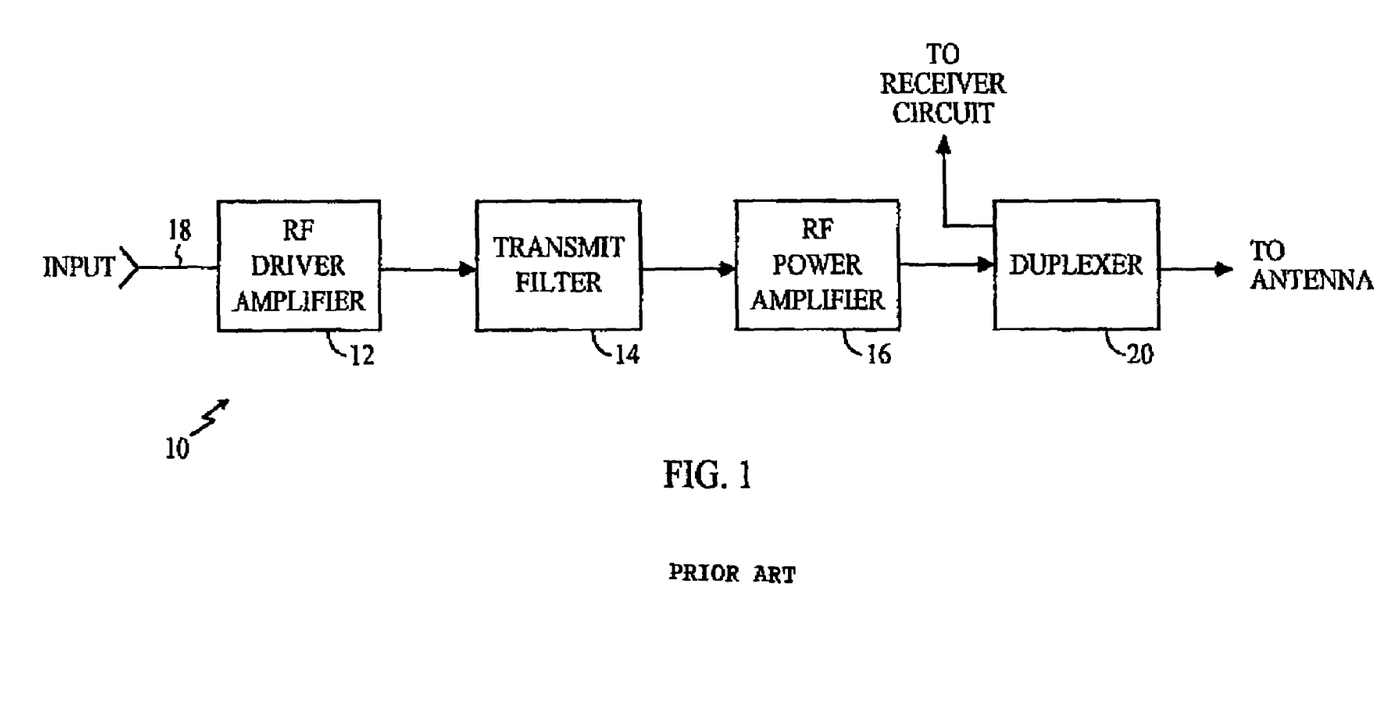
FIG. 1 is a functional block diagram of a conventional transmitter output stage of a wireless communication device.

The use of wireless communication devices, in applications such as wireless telephones, is widespread. The output stage of a wireless communication device includes radio frequency (RF) amplifiers. This is true of most wireless communication devices regardless of the form of modulation, such as AM, FM, and the like. A typical output stage 10 for a wireless communication device is illustrated in FIG. 1 and comprises an RF driver amplifier 12, a transmit filter 14, and an RF power amplifier 16. An output port of the RF driver amplifier 12 is coupled to an input port of the transmit filter 14. Similarly, an output port of the transmit filter 14 is coupled to an input port of the RF power amplifier 16.

An input 18 to the RF driver amplifier comes from other circuitry not illustrated in FIG. 1. Those skilled in the art will appreciate that the other circuitry not illustrated includes, by way of example, processing circuits such as a modulator. For example, the wireless device may be a code division multiple access (CDMA) wireless communication device. In this example, the additional circuitry, which is not illustrated in FIG. 1, would include CDMA processing circuitry and a CDMA modulator circuit.

An output from the RF power amplifier 16 is coupled to a duplexer 20, the output of which is coupled to an antenna circuit, which is also omitted from FIG. 1 for the sake of brevity. Those skilled in the art will appreciate that the antenna circuit may comprise an antenna (not shown). The duplexer 20 permits the antenna to be used for both transmission and reception of radio frequency signals.

In an exemplary embodiment, the transmit filter 14 is a band pass filter selected to match the frequency range of operation of the wireless communication device. The transmit filter 14 may be implemented as a SAW filter or a ceramic filter. Those skilled in the art will understand the requirements of the transmit filter 14, which need not be described in greater detail herein.

For maximum efficiency in power transfer, it is desirable that the output impedance of the RF driver amplifier 12 match the input impedance of the transmit filter 14. Similarly, the output impedance of the transmit filter 14 should match the input impedance of the RF power amplifier 16 for maximum power transfer. If the RF driver amplifier 12 has a fixed gain associated therewith, it is within the knowledge of one skilled in the art to design an amplifier to have the appropriate output impedance to match the input impedance of the transmit filter. Alternatively, a matching circuit (not shown) may be inserted between the RF driver amplifier 12 and the transmit filter 14.

Failure to properly match the output impedance of the RF driver amplifier 12 to the input impedance of the transmit filter 14 results in a high voltage standing wave ratio (VSWR) and sub-optimal power transfer between the RF driver amplifier and the transmit filter. The impedance mismatch also adversely affects the operation of the transmit filter 14 resulting in a degradation of the in-band and out-of-band characteristics of the transmit filter. This mismatch may result in increased filter insertion loss, reduced filter gain flatness, and degraded out-of-band filter rejection.

Furthermore, the filter impedance at the output port of the transmit filter 14 (where the power amplifier 16 is coupled) is a function of the impedance seen by the transmit filter 14 at its input port. This input impedance must be carefully controlled in order to ensure the stability, linearity, and efficiency of the RF power amplifier 16. Thus, proper control of the output impedance of the RF driver amplifier 12 is critical to operation of the components following the driver amplifier in the transmitter chain (i.e., the transmit filter 14 and the RF power amplifier 16).

In known implementations of a wireless communication device, the gain of the RF driver amplifier 12 is not continuously varied in any significant way. In certain applications, the current drain of the RF driver amplifier 12 is altered to save current and thus maximize battery life. One side effect of such a decrease in the drain current is a minimal fluctuation on the gain of the RF driver amplifier, which is considered to be essentially a fixed gain. However, in applications where it is desirable to significantly vary the gain of the RF driver amplifier, there is a great need for a system and method to properly match the output impedance of the driver amplifier and thus improve performance of the output stage 10. The present invention provides this and other advantages as will be apparent from the following detailed description and accompanying figures.

BRIEF SUMMARY OF THE INVENTION

The present invention is embodied in a radio frequency (RF) output circuit for wireless communication and comprises a variable gain RF amplifier having an input, an output, and a gain control input to control amplifier gain. The circuit also includes a variable impedance load coupled to the amplifier output with the load having an impedance level based on the amplifier gain.

In one embodiment, the impedance level of the variable impedance load is inversely related to the amplifier gain. The circuit may further comprise a transmit filter having a filter input and a filter output with the filter input coupled to the RF amplifier output. The filter has an input impedance and the variable impedance load operates in conjunction with the RF amplifier to present an impedance to match the filter input impedance.

The circuit may further comprise an impedance matching circuit connected intermediate the RF amplifier output and the filter input. The circuit may also include an RF power amplifier having a fixed gain and coupled to the filter output.

In one implementation, the variable impedance load comprises a semiconductor device whose impedance is based on a control current. The control current may be a portion of a current mirror.

The variable impedance load may comprise a transistor in series with a resistor wherein the transistor is controlled by a control current whose current value is related to the amplifier gain. In one embodiment, the transistor may be a field effect transistor.

DETAILED DESCRIPTION OF THE PREFERRED EMBODIMENTS

The present invention provides a variable impedance load whose input impedance varies based on the gain of a variable gain RF driver amplifier.

Figure 2:
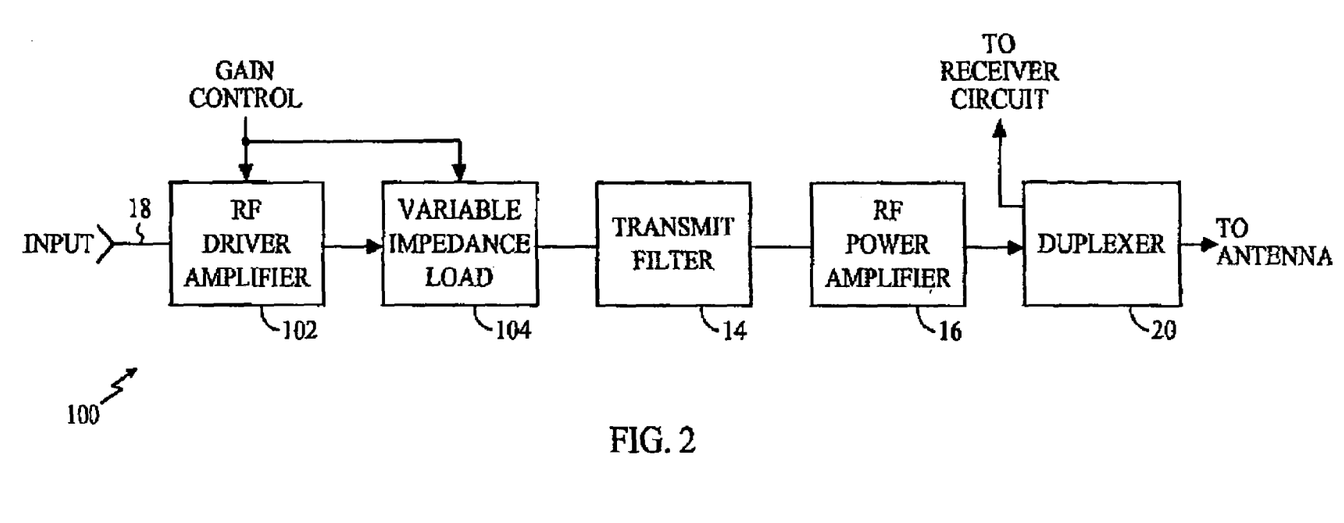
FIG. 2 is a functional block diagram of an output stage of a wireless communication device in accordance with the principles of the present invention.

An exemplary embodiment of the present invention is illustrated in a system 100, illustrated as a functional block diagram in FIG. 2. An RF driver amplifier 102 has a gain control input. In an exemplary embodiment, the RF driver amplifier 102 has a variable gain of approximately 20–40 decibels (dB). As those skilled in the art will appreciate, the output impedance of the RF driver amplifier 102 varies significantly as a function of the gain of the amplifier. Specifically, as the gain of the amplifier increases, the output current of the RF driver amplifier 102 increases and the output impedance decreases. Conversely, as the gain of the RF driver amplifier 102 decreases, the output current decreases and the output impedance of the RF driver amplifier increases. Thus, the output impedance varies inversely with the gain (and the output current, which is directly related to the gain of the RF driver amplifier 102). It is this variable output impedance that creates difficulties in impedance matching with the transmit filter 14.

To compensate for the variable output impedance of the RF driver amplifier 102, the system 100 includes a variable impedance load 104. The gain control signal, or a signal related thereto, is coupled to the variable impedance load 104. As the gain of the RF driver amplifier 102 is altered, its output impedance inherently changes. The variable impedance load 104 changes in a corresponding fashion so as to maintain a proper impedance match with the RF driver amplifier. Because the variable impedance load is maintained, the VSWR of the combination RF driver amplifier 102 and variable impedance load 104 is significantly reduced when compared to a fixed impedance load, such as the fixed impedance of the transmit filter 14. Because the transmit filter 14 sees the appropriate impedance, the in-band and out-of-band characteristics of the transmit filter are properly maintained. As noted above, the output impedance of the transmit filter 14 is a function of the impedance at the input port. Thus, the entire output circuit (i.e., the transmit filter 14 and the RF power amplifier 16) of the wireless communication device operates more effectively with the variable impedance load 104.

In one embodiment, the RF power amplifier 16 has a fixed gain. In other implementations, the RF power amplifier 16 may have a step-gain control to permit different gain settings for the RF power amplifier. For example, the RF power amplifier may have a low-gain setting and a high-gain setting where each setting has a specified gain value. In another implementation, the RF power amplifier may have a low-, medium-, and high-gain settings where each gain setting has a specified value. The present invention is designed to operate with an RF power amplifier having a fixed gain or a variable gain, such as the step-gain settings described above.

Figure 3:
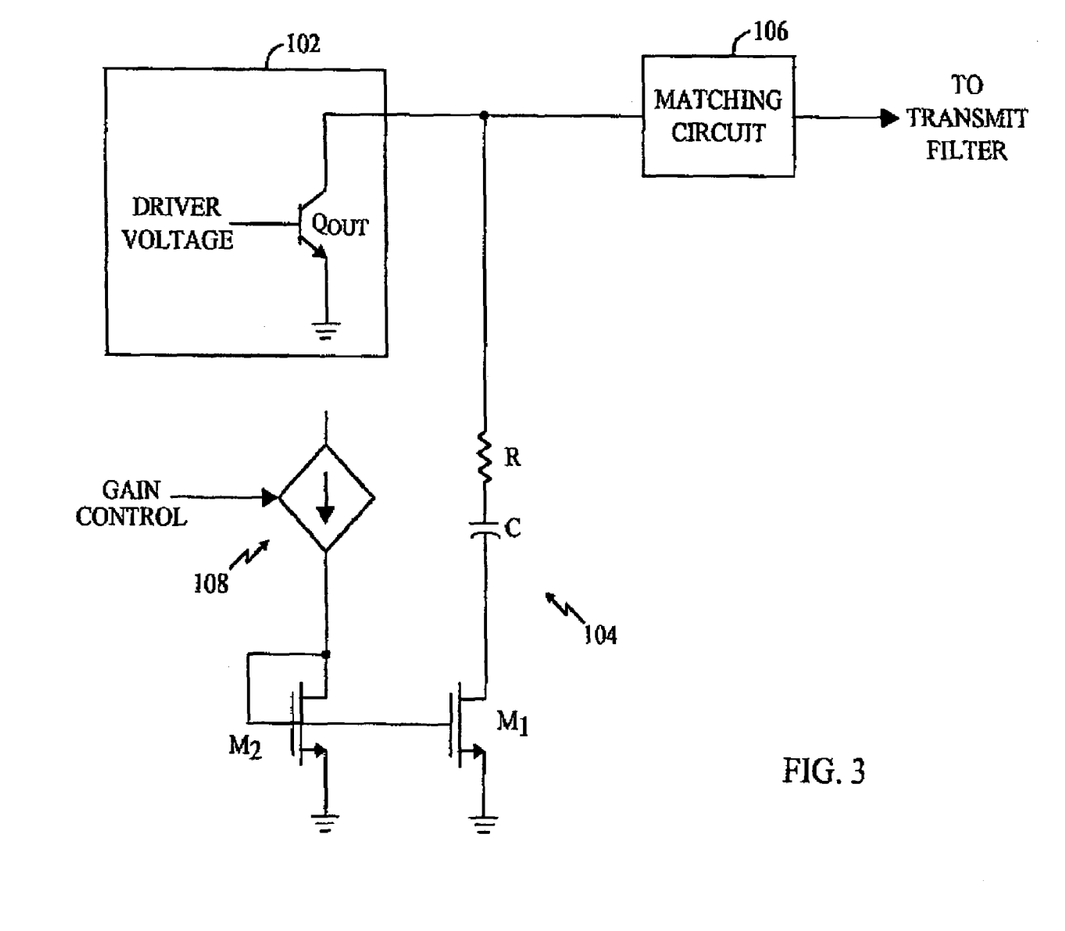
FIG. 3 is a detailed functional block diagram of the variable impedance load of the present invention.

A more detailed diagram of the variable impedance load is illustrated in FIG. 3 as an output transistor $Q_{OUT}$, which is actually the output driver from the RF driver amplifier 102 (see FIG. 2). For the sake of clarity, the associated bias circuitry is not shown in FIG. 3. However, biasing circuitry for a common emitter NPN transistor is known in the art and need not be described in greater detail herein. The output of the transistor $Q_{OUT}$ is controlled by a driver voltage, which is proportional to the gain setting. The gain setting may be a fixed selected value or may be part of an automatic gain control (AGC). Regardless of the source of the driver voltage, it should be understood that the driver voltage is in some manner proportional to the gain of the driver amplifier 102.

Also illustrated in FIG. 3 is a matching circuit 106, which provides impedance matching with the transmit filter 14. Those skilled in the art will appreciate that the matching circuit 106 ideally functions as an impedance transformer and has little or no loading effect on the RF driver amplifier 102 or the variable load impedance 104. The matching circuit 106 merely transforms the impedance that it sees at its input and, based on the transformation, presents an impedance at its output. In an exemplary embodiment, the matching circuit 106 provides a 50 ohm output impedance for coupling into a 50 ohm input impedance of the transmit filter 14. The variable impedance load 104 must operate in conjunction with the varying output impedance of the RF driver amplifier 102 to provide the proper impedance at the input of the matching circuit 106 such that the matching circuit can approximately provide the desired 50 ohm output impedance and results in a suitable VSWR. Matching circuits per se are well known in the art and need not be described in greater detail herein.

The variable impedance load 104 comprises a MOSFET transistor $M_1$ coupled in series with a resistor R and a capacitor C. These three components are coupled in parallel with the output transistor $Q_{OUT}$. The capacitor C is selected to block DC current through the FET $M_1$. The value of C is sufficiently high that it has little or no impedance at the typical RF frequencies used by a wireless communication device.

As noted above, the capacitor C is provided to block DC current from flowing through the FET $M_1$. This results in a zero volt $V_{DS}$ for the FET $M_1$ thus assuring its operation in the triode region.

The impedance presented as a load to the RF driver amplifier 102 is the series combination of the resistor R and the FET $M_1$. The resistor R has a fixed value and thus presents a fixed impedance while the FET $M_1$ provides a variable impedance, which is controlled in the manner described below. The gate voltage of the FET $M_1$ is provided by a diode connected FET $M_2$. Current is provided to the FET $M_2$ by a control circuit 108. In FIG. 3, the control circuit 108 is implemented as a controlled current source.

The control circuit 108, in turn, is controlled by a signal designated in FIG. 3 as the gain control. Those skilled in the art will recognize that the gain control for the RF driver amplifier 102 (see FIG. 2) and the gain control for the variable impedance load 104 are related, but need not be identical. That is, signals relating to the gain of the RF driver amplifier 102 may be further processed by other circuitry (not shown) in a known manner, which need not be described in greater detail herein.

Figure 4:
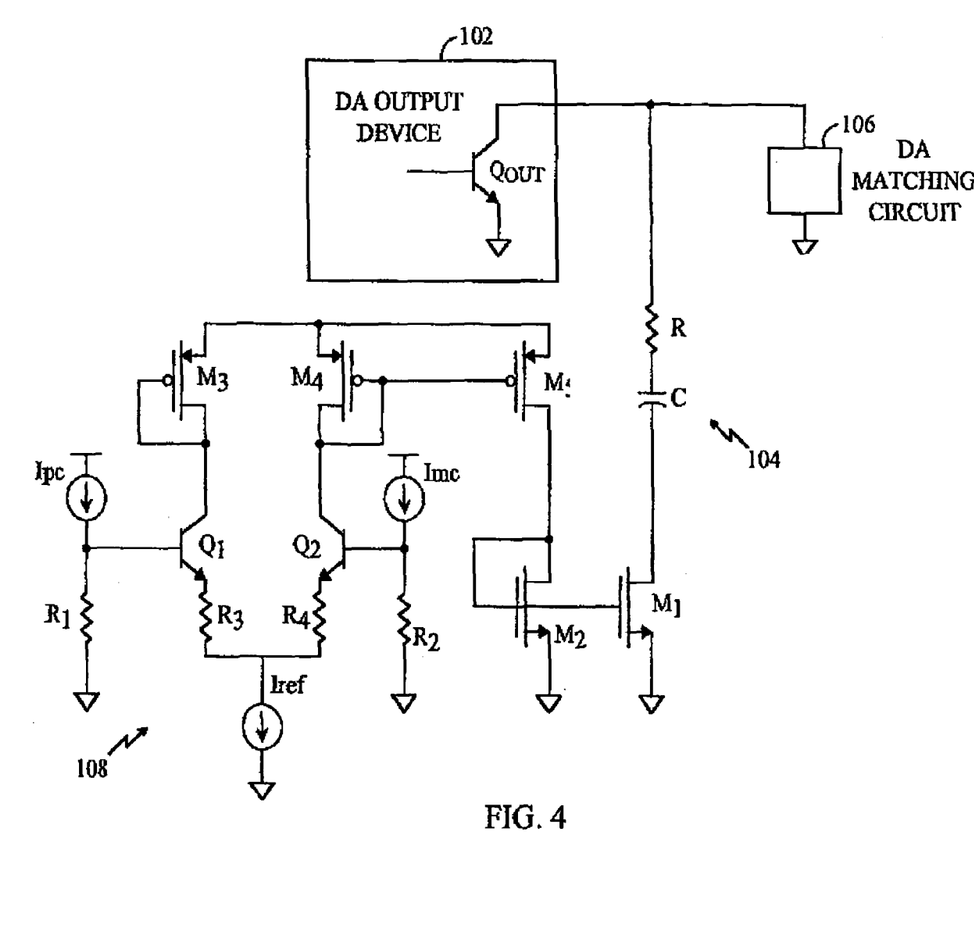
FIG. 4 is an example schematic diagram implementing the invention of FIG. 2.

FIG. 4 is a schematic diagram illustrating one implementation of the control circuit 108. Those skilled in the art will recognize that other suitable circuits may be used to implement the control circuit 108. With reference to FIG. 4, the control circuit 108 is implemented with a differential bipolar transistor pair designated herein as $Q_1$ and $Q_2$. The emitters of transistors $Q_1$ and $Q_2$ are coupled through resistors $R_3$ and $R_4$, respectively, to a reference current source $I_{ref}$. The current source $I_{ref}$ is a fixed current source whose absolute value is not critical and can be readily determined by those skilled in the art. In an exemplary embodiment, the current source $I_{ref}$ provides a current of approximately 100 microamps ($\mu$A). The base voltage of the transistors $Q_1$ and $Q_2$ are provided by current sources $I_{pc}$ and $I_{mc}$ applied across resistors $R_1$ and $R_2$, respectively. The current source $I_{pc}$ is a positive control signal while the current source $I_{mc}$ is a minus (i.e., negative) control signal. The current sources $I_{mc}$ and $I_{pc}$ can linearly vary with the gain control of the RF driver amplifier 102 (see FIG. 2). In an exemplary embodiment, the current sources $I_{pc}$ and $I_{mc}$ vary from 10–50 $\mu$A and move in opposite directions based on the gain setting of the RF driver amplifier 102. In an exemplary embodiment, the current sources $I_{pc}$ and $I_{mc}$ are set to approximately 30 $\mu$A for a midrange gain setting of the RF driver amplifier 102. The 30 $\mu$A setpoint may be referred to as the common mode current setpoint.

The collectors of the transistors $Q_1$ and $Q_2$ are coupled to FETs $M_3$ and $M_4$, respectively. As the currents $I_{pc}$ and $I_{mc}$ vary linearly, the ratio of the currents through the collectors of transistors $Q_1$ and $Q_2$ vary exponentially. When the current through transistor $Q_1$ increases, the current through FET $M_3$ also increases. At the same time, the current through transistor $Q_2$ decreases and the current through FET $M_4$ also decreases. Conversely, when the current through transistor $Q_1$ decreases, the current through FET $M_3$ also decreases. At the same time as the current through the transistor $Q_2$ increases, the current through the FET $M_4$ also increases.

The FET $M_4$ is connected to an FET $M_5$ in a current mirror configuration. In one embodiment, the current through the FET $M_5$ equals the current through the FET $M_4$. In an exemplary embodiment, the current through the FET $M_5$ is a multiple of the current through the FET $M_4$. The drain of the FET $M_5$ is coupled to the diode connected FET $M_2$ such that the gate voltage of the FET $M_2$ is varied in accordance with the current $I_D$ of the FET $M_5$. The same gate voltage applied to the FET $M_2$ is also applied to the FET $M_1$. Thus, as the gain of the driver amplifier 102 varies, the impedance provided by the FET $M_1$ also varies.

When the output power of the RF driver amplifier 102 (see FIG. 2) is at a maximum gain level, the control current $I_{pc}$ is at a maximum value while the control current $I_{mc}$ is at a minimum value. The current through the transistor $Q_2$, and thus the current through the FET $M_4$, are also at a minimum. As a result, the current through the current mirror of FET $M_5$ and thus the current through the FET $M_2$ is also at a minimum. Under these circumstances, the gate voltage of the FET $M_1$ is at a minimum such that the FET $M_5$ is turned off (i.e., high impedance). This arrangement provides minimum loading (i.e., high impedance) to maximize the output power transferred to the transmit filter 14 (see FIG. 2) via the matching circuit 106.

Figure 5:
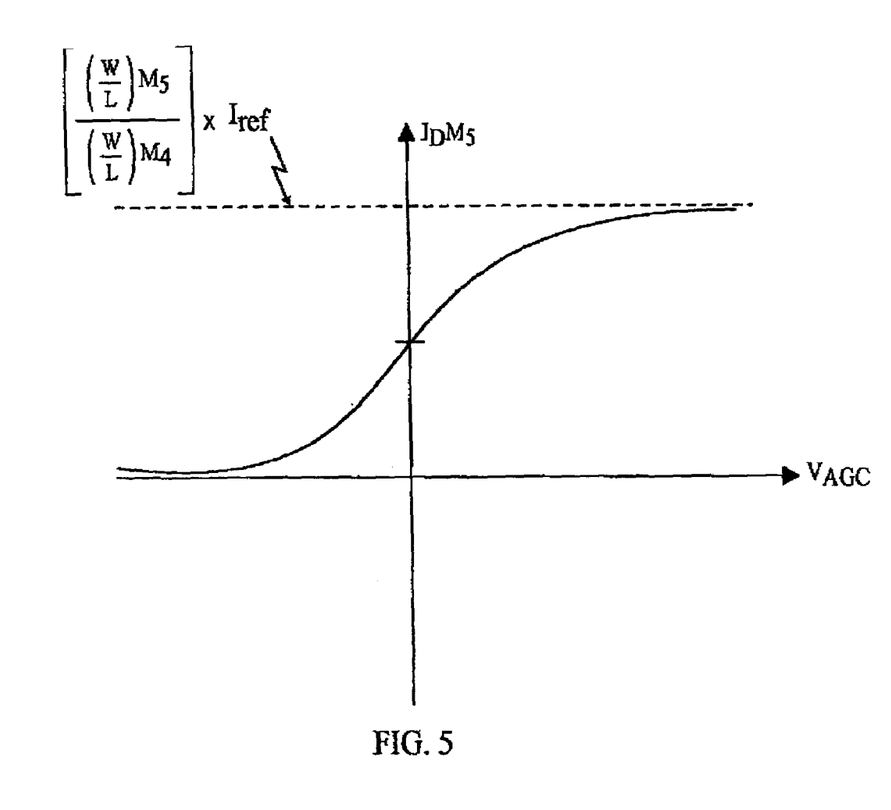
FIG. 5 is a graph illustrating a compensation current produced by the circuit of FIG. 4.

As the control currents $I_{pc}$ and $I_{mc}$ vary linearly, the current through the transistor $Q_2$ varies exponentially. The operation of the transistor $Q_2$ generates a current that is mirrored into the FET $M_5$. FIG. 5 is a graph illustrating the desired current through the current mirror of FET $M_5$ based on the differential voltage across the differential transistors $Q_1$ and $Q_2$. The voltage $V_{agc}$ represents the differential voltage across the transistors $Q_1$ and $Q_2$. As the differential voltage increases, the current asymptotically approaches a maximum value.

As previously noted, the current through FET $M_5$ may be a multiple of the current through FET $M_4$ and the transistor $Q_2$, which has a maximum value of $I_{ref}$. Similarly, as the differential voltage across the transistors $Q_1$ and $Q_2$ becomes more negative, the current through the current mirror $M_5$ asymptotically approaches zero. Although not mathematically precise, it is convenient to characterize the curve of FIG. 5 as a hyperbolic tangent (tanh) function. That is, as the differential voltage across the transistors $Q_1$ and $Q_2$ increases, the current through the FET $M_5$ (and thus the FET $M_2$) increases at an exponential rate, but asymptotically approaches a maximum value that is related to the bias current $I_{ref}$. The actual current may be a function of the geometry of the FET $M_4$ and the FET $M_5$. As those skilled in the art will appreciate, the current through the transistors may be determined by the width of the channel divided by the length of the channel. The maximum current illustrated in FIG. 5 is determined by the W/L ratio of the FET $M_5$ divided by the W/L ratio of the FET $M_4$.

The circuit of FIG. 4 generates a current that approximates a tanh function, which is related to tanh ($[K]V_{agc}/V_T$) where K is a constant that takes into account various offsets that may be produced in the circuit due to the resistors. The value $V_{agc}$ is the differential voltage generated across the transistors $Q_1$ and $Q_2$ by the flow of the control currents $I_{pc}$ and $I_{mc}$. The value $V_T$ is referred to as the thermal voltage of a bipolar transistor, and is approximately 26 mV at 300° K. The tanh function provides an increasing control current to the FET $M_1$ to provide a nonlinearly increasing impedance.

At maximum gain of the RF driver amplifier 102 (see FIG. 2), the variable output impedance 104 is at a high impedance state. As the gain level decreases in the RF driver amplifier 102, the value of the control current $I_{pc}$ decreases while the value of the control current $I_{mc}$ increases. This increases the flow of current through the transistor $Q_2$ and the FET $M_4$. The increased current at $M_4$ is reflected in the current mirror of FET $M_5$. The increase current flow through FET $M_5$ passes through FET $M_2$. This in turn causes FET $M_1$ to turn on and thus the load impedance decreases, but initially decreases at a relatively low amount since the RF driver amplifier is still at relatively high power. For example, if the output gain of the RF driver amplifier 102 is decreased to approximately 80% of the maximum gain value, then the bias current through the FET $M_5$ and the FET $M_2$ increases to provide some drive current to the FET $M_1$ such that the load impedance decreases, but is still a relatively high impedance value since the output power of the RF driver amplifier is still relatively high and the output impedance is relatively well matched. At lower gain settings, the gate voltage of the FET $M_1$ increases to provide a lower impedance load at the output of the RF driver amplifier since the output impedance of the RF driver amplifier 102 is higher at lower gain settings.

When the RF driver amplifier 102 (see FIG. 2) is at a minimum gain level, the control current $I_{pc}$ is at a minimum value while the control current $I_{mc}$ is at a maximum value. As a result of the high current value for the control current $I_{mc}$, the transistor $Q_2$ and thus the FET $M_4$ are at maximum values. The current through the current mirror of FET $M_5$ is also at a maximum value. As a result, the current through the FET $M_2$ is also high and the gate voltage of the transistors of the FETs $M_1$ and $M_2$ are also high, such that the FET $M_1$ is turned on. As a result, the variable impedance load 104 provides maximum loading (i.e., low impedance) at the output of the RF driver amplifier 102 (see FIG. 2).

At high gain levels for the RF driver amplifier 102 (see FIG. 2), the load impedance is determined primarily by the high impedance value of the FET $M_1$, which is turned off. At low gain levels for the RF driver amplifier 102, the load impedance is determined primarily by the resistor R because the FET $M_1$ is turned on as much as possible. At intermediate gain levels for the RF driver amplifier 102, the load impedance is provided by a combination of the resistor R and the impedance provided by the FET $M_1$. At intermediate voltage settings, the control currents $I_{pc}$ and $I_{mc}$ are in between the extreme values described above and the FET $M_1$ is partially turned on. Thus, the variable impedance load 104 is at a high impedance value when the amplification level of the RF driver amplifier 102 is high and provides a low impedance load when the amplification value for the RF driver amplifier 102 is low.

In the embodiments illustrated in FIGS. 3–4, the FET $M_1$ provides the variable impedance coupled to the output of the RF power amplifier 102. The FET $M_1$ is a voltage controlled device wherein the voltage applied to the gate of the FET $M_1$ is based on a control current from the control circuit 108. However, those skilled in the art will appreciate that other embodiments of the control circuit 108 may generate a control voltage, which is applied to the gate of the FET $M_1$. In yet another alternative embodiment, the FET $M_1$ may be replaced with a bipolar transistor, which is a current controlled device. In that embodiment, the control circuit 108 may provide a control current directly to the base of the bipolar transistor. In yet another alternative embodiment, the control circuit 108 may generate a control voltage that is applied to the base of the bipolar transistor to generate the appropriate current into the base of the transistor to permit the variable impedance load to be applied to the output of the RF driver amplifier 102. The present invention is not limited by the specific implementation of the control circuit 108 (e.g., a control voltage or a control current) not is it limited by the specific device used to implement the variable impedance load (e.g., a bipolar transistor or an FET).

Figure 6:
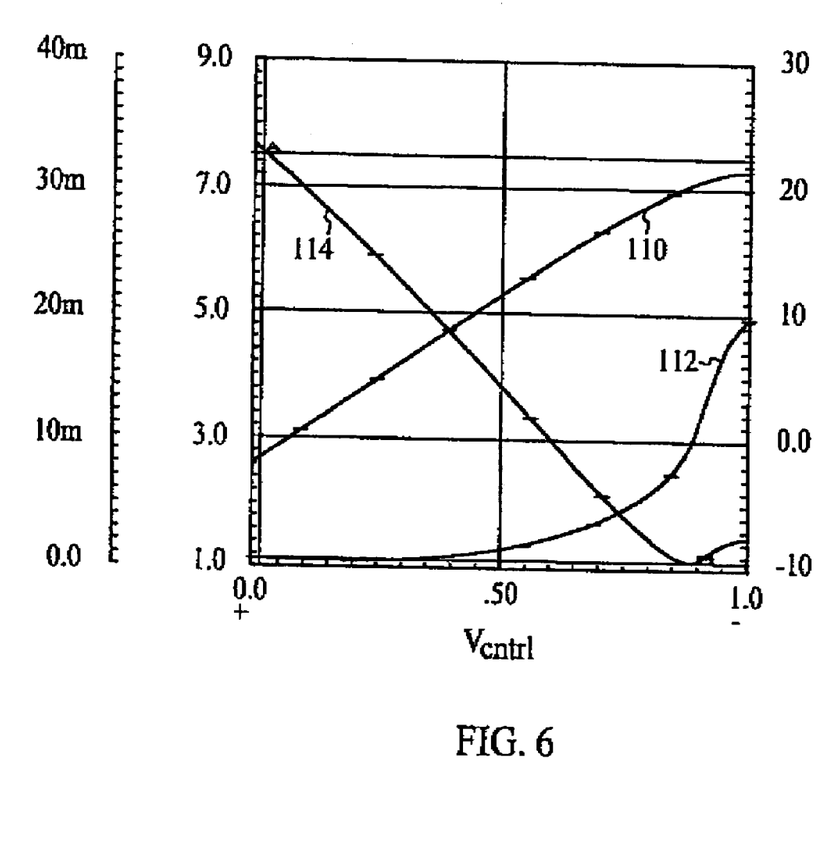
FIG. 6 is a graph illustrating circuit performance of the conventional output stage.
Figure 7:
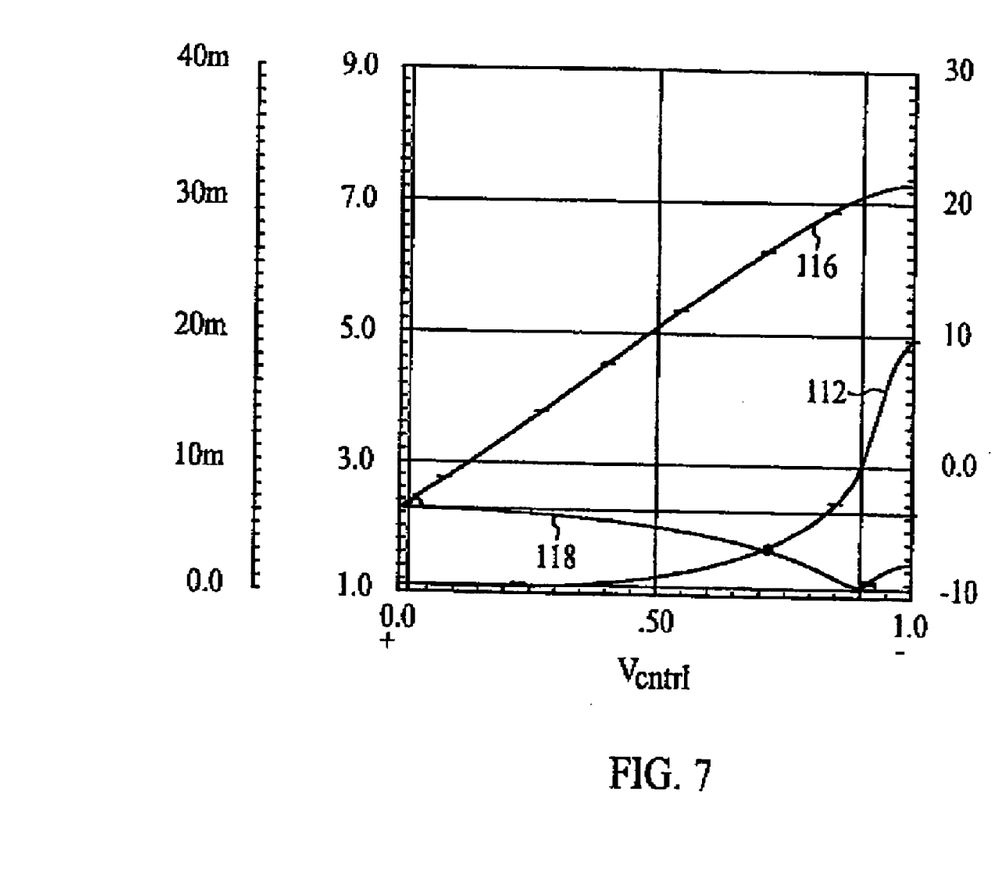
FIG. 7 is a graph illustrating characteristics of the output stage of the present invention.

FIGS. 6 and 7 are graphs derived from circuit simulation to show the operation of the RF driver amplifier 102 with and without the variable impedance load 104. FIG. 6 is a graph illustrating the VSWR for various gain settings in the absence of the variable impedance load 104. As a gain control voltage $V_{cntrl}$ varies between 0.0 and 1.0 volts, the gain of the RF driver amplifier 102 varies from a slightly negative value to approximately +21.5 dB. The variable gain is illustrated in FIG. 6 by a curve 110. A curve 112 illustrates the current through the output device $Q_{OUT}$ of the RF driver amplifier 102. It should be noted that the output current increases dramatically as the gain of the RF driver amplifier 102 increases. Also illustrated in FIG. 6 is the VSWR, which is illustrated by a curve 114. At low gains, the VSWR exceeds 7.0 while at higher gains, the VSWR decreases to approximately 1.0. At low power, the output impedance of the RF driver amplifier 102 may be several hundred ohms, which is not a good match for 50 ohm input impedance of the transmit filter 14. The result is the high VSWR shown in FIG. 6.

In contrast, the use of the variable impedance load 104 permits better matching of the load impedance with the varying output impedance of the RF driver amplifier 102. This is illustrated in the graph of FIG. 7 where the variable gain setting is illustrated by a curve 116. In an ideal circuit design, the gain curve 110 would precisely match the gain curve 116. However, the introduction of the variable impedance load 104 has a minor effect on the gain at lower gain settings. This is reflected by the slight difference between the gain control curves 110 and 116 of FIGS. 6 and 7, respectively. FIG. 7 also includes the curve 112 illustrating the current of the output device $Q_{OUT}$ of the RF driver amplifier 102. However, the variable impedance load 102 provides a significantly reduced VSWR, as illustrated by a curve 118 in FIG. 7. While the VSWR in the absence of the variable impedance load 104 exceeds 7.0 (see FIG. 6), the VSWR with the variable impedance load 104 is approximately 2.5 or less. A VSWR of less than 3.0 would be considered acceptable for the present application where the transmit filter 14 is a SAW filter. For other applications, the variable impedance load 104 may be designed to have a different maximum value for VSWR based on the requirements of other components, such as the transmit filter 14.

Thus, the system 100 provides a variable impedance load that reduces the VSWR and thus improves the efficiency of power transfer from the RF driver amplifier 102 through the transmit filter 14 and the RF power amplifier 16. The result is improved efficiency in the output stage 100 and improved operation of the wireless communication device.

One skilled in the art will recognize that other implementations of the variable output impedance load may be provided in accordance with the teachings of the present invention. For example, other semiconductor devices may be employed to implement the variable impedance load. Similarly, other devices may be used to provide a control current proportional to the gain setting of the RF driver amplifier. Other mathematical functions other than a tanh function of FIG. 5 may be used to control the level of drive current provided to the variable impedance semiconductor device. The control signal for the variable impedance load may be derived from sources related to the gain of the RF driver amplifier other than the gain control itself. For example, the control current could be derived from a measurement of the output current from, by way of example, the transistor $Q_{OUT}$.

It is to be understood that even though various embodiments and advantages of the present invention have been set forth in the foregoing description, the above disclosure is illustrative only, and changes may be made in detail, yet remain within the broad principles of the invention. Therefore, the present invention is to be limited only by the appended claims.

What is claimed is:

1. A radio frequency (RF) output circuit for wireless communication, comprising:
   a variable gain RF amplifier having an input, an output, and a gain control input to control amplifier gain;
   a variable impedance load coupled to the amplifier output, the load having an impedance level related to the amplifier gain, wherein the variable impedance load comprises a semiconductor device whose impedance is based on a control current; and
   a transmit filter having a filter input and a filter output, the filter input coupled to the RF amplifier output, the filter having an input impedance, the variable impedance load operating in conjunction with the RF amplifier to present an impedance to match the filter input impedance.

2. The circuit of claim 1 wherein the impedance level is inversely related to the amplifier gain.

3. The circuit of claim 1, further comprising an impedance matching circuit connected intermediate the RF amplifier output and the filter input.

4. The circuit of claim 1, further comprising an RF power amplifier having a specified gain and coupled to the filter output.

5. The circuit of claim 1 wherein the control current is a portion of a current mirror.

6. The circuit of claim 1 wherein the variable impedance load comprises a transistor in series with a resistor.

7. The circuit of claim 6 wherein the transistor is a field effect transistor.

8. The circuit of claim 6 wherein the transistor has an impedance value dependent on a control current, the control current being related to the amplifier gain.

9. The circuit of claim 6, further comprising a current mirror to generate the control current and first and second current sources, the first current source generating a linear current directly proportional to the amplifier gain and the second current source generating a linear current inversely proportional to the amplifier gain to control the current mirror.

10. A radio frequency (RF) output circuit for wireless communication, comprising:
   RF amplifier means having an input, an output, and a gain control input to control amplifier gain;
   load means coupled to the amplifier output;
   control means coupled to the load means for varying an impedance of the load means based on the amplifier gain, wherein the load means comprises a semiconductor device whose impedance is dependent on a control current generated by the control means; and
   filter means for faltering an output signal from the RF amplifier means, the load means operating in conjunction with the RF amplifier means to present an impedance to match an input impedance of the filter means.

11. The circuit of claim 10 wherein the control means varies the impedance of the load means in an inversely relationship with the amplifier gain.

12. The circuit of claim 10, further comprising an impedance matching means connected intermediate the RF amplifier means and the filter means.

13. The circuit of claim 10 wherein the load means comprises a transistor in series with a resistor, the transistor impedance being dependent on a control current generated by the control means.

14. A method of compensating for output impedance variation in a radio frequency (RF) output circuit for wireless communication, comprising:
   varying a gain in an RF amplifier;
   coupling a load coupled to an output of the RF amplifier; and
   varying an impedance level of the load, based on the amplifier gain, wherein coupling the load coupled to the output of the RF amplifier comprises coupling a semiconductor device to the output of the RF amplifier, the impedance of the semiconductor device being dependent on a control current, wherein a transmit filter is coupled to the RF amplifier output, the filter has an input impedance, and varying the impedance of the load comprises varying the impedance of the load in conjunction with an RF amplifier output impedance to present an impedance to match the filter input impedance.

15. The method of claim 14 wherein the impedance level is inversely related to the amplifier gain.

16. The method of claim 14 for use with an impedance matching circuit connected intermediate the RF amplifier and the filter wherein varying the impedance of the load comprises varying the impedance of the load in conjunction with an RF amplifier output impedance to present an impedance to an input of the impedance matching circuit such that an output impedance of the impedance matching circuit matches the filter input impedance.

17. The method of claim 14 wherein coupling the load coupled to the output of the RF amplifier comprises coupling a transistor in series with a resistor to the output of the RF amplifier, the impedance of the transistor being dependent on a control current.

* * * * *